United States Patent

Yamawaki et al.

(10) Patent No.: US 7,933,105 B2
(45) Date of Patent: Apr. 26, 2011

(54) SWITCHING ELEMENT DRIVING DEVICE AND SWITCHING ELEMENT DRIVING METHOD

(75) Inventors: Hideo Yamawaki, Toyota (JP); Hajime Kosugi, Toyota (JP)

(73) Assignee: Toyota Jidosha Kabushiki Kaisha, Toyota-shi (JP)

(*) Notice: Subject to any disclaimer, the term of this patent is extended or adjusted under 35 U.S.C. 154(b) by 195 days.

(21) Appl. No.: 12/375,181

(22) PCT Filed: Sep. 4, 2007

(86) PCT No.: PCT/IB2007/002545
§ 371 (c)(1),
(2), (4) Date: Jan. 26, 2009

(87) PCT Pub. No.: WO2008/029248
PCT Pub. Date: Mar. 13, 2008

(65) Prior Publication Data
US 2009/0256618 A1    Oct. 15, 2009

(30) Foreign Application Priority Data
Sep. 5, 2006  (JP) .............................. 2006-240634

(51) Int. Cl.
*H02H 3/08*   (2006.01)
*H02H 9/02*   (2006.01)
*H02H 3/00*   (2006.01)

(52) U.S. Cl. ................... 361/93.1; 361/93.2; 361/93.7; 361/93.9; 361/79

(58) Field of Classification Search .............. 361/56, 361/93.1, 93.2, 93.7, 93.9
See application file for complete search history.

(56) References Cited

U.S. PATENT DOCUMENTS

| 6,057,728 A | 5/2000 | Igarashi |
| 2002/0070772 A1 | 6/2002 | Neacsu et al. |

FOREIGN PATENT DOCUMENTS

| EP | 0 817 381 A2 | 1/1998 |
| JP | A-4-172962 | 6/1992 |
| JP | A-10-070878 | 3/1998 |
| JP | A-11-112313 | 4/1999 |

(Continued)

OTHER PUBLICATIONS

Masahiro Kimata, Semiconductor device drive circuit, Publication Date: Jul. 1, 1998, Drawing 14, col. 23 and col. 24.*

(Continued)

*Primary Examiner* — Dharti H Patel
(74) *Attorney, Agent, or Firm* — Kenyon & Kenyon LLP

(57) ABSTRACT

A switching element driving device has a first transistor that decreases the gate voltage of a power element at a faster rate than during a normal turn-off, and a second transistor that decreases the gate voltage of the power element at a slower rate than during a normal turn-off. If the gate voltage detected by the gate voltage monitoring means when an overcurrent in the power element is detected by overcurrent detection means is greater than a predetermined value, the gate voltage is decreased by the first transistor, and then, while the power element remains on, the gate voltage is decreased by the second transistor. If the gate voltage detected by the gate voltage monitoring means when an overcurrent in the power element is detected by overcurrent detection means is less than or equal to the predetermined value, the gate voltage is decreased only by the second transistor.

2 Claims, 5 Drawing Sheets

FOREIGN PATENT DOCUMENTS

| | | |
|---|---|---|
| JP | A-2000-295838 | 10/2000 |
| JP | A-2002-369495 | 12/2002 |
| JP | A-2003-134797 | 5/2003 |
| JP | A-2003-248318 | 10/2003 |
| JP | A-2005-006381 | 1/2005 |
| JP | B-3649154 | 2/2005 |
| JP | A-2006-109286 | 4/2006 |

OTHER PUBLICATIONS

G. Castino, et al.: International Rectifier Corporation, Application Notes AN-984J, circa 1990.

* cited by examiner

SWITCHING ELEMENT DRIVING DEVICE AND SWITCHING ELEMENT DRIVING METHOD

This is a 371 national phase application of PCT/IB2007/002545 filed 4 Sep. 2007, claiming priority to Japanese Patent Application No. 2006-240634 filed 5 Sep. 2006, the contents of which are incorporated herein by reference.

BACKGROUND OF THE INVENTION

1. Field of the Invention

The invention relates to a driving technology for a switching element adapted to the case where overcurrent is detected in the switching element.

2. Description of the Related Art

A method of protecting a semiconductor switching element, such as an insulated gate bipolar transistor (IGBT) or the like, at the time of shortcircuit is known (see, e.g., "APPLICATION NOTES", AN-984J (FIG. 5 on page 5), IR (International Rectifier) Corporation). According to the described protection method, if a malfunction, such as a load shortcircuit or the like, occurs, the gate drive voltage is rapidly lowered to a certain level, and then if after a period of time, the malfunction continues to exist, the gate drive voltage is shut off. This technology is intended to reduce the malfunction electric current and therefore extend the malfunction verification period.

However, in the related art described above, detection of overcurrent is followed by the rapid lowering of the gate voltage regardless of the on-state of the switching element. Therefore, the gate voltage is rapidly lowered even when overcurrent is detected during an early period in a turning-on process during which the gate voltage has not sufficiently risen. If the gate voltage is rapidly lowered when the gate voltage has not sufficiently risen, the switching element is rapidly turned off, so that the off-surge voltage increases.

SUMMARY OF THE INVENTION

The invention provides a switching element driving device and a switching element driving method that executes an appropriate protection operation against not only the overcurrent occurring during a complete-on state but also the overcurrent occurring during an early period in a turn-on.

A switching element driving device in accordance with an aspect of the invention is characterized by comprising: overcurrent detection means for detecting an overcurrent that flows through a switching element; first gate voltage decrease means for decreasing gate voltage of the switching element at a rate that is faster than the rate of decrease of the gate voltage at a time of a normal turn-off; second gate voltage decrease means for decreasing the gate voltage of the switching element at a rate that is slower than the rate of decrease of the gate voltage at the time of the normal turn-off; and gate voltage monitoring means for monitoring the gate voltage of the switching element, wherein if it is determined by the gate voltage monitoring means that the gate voltage is greater than a predetermined value when the overcurrent is detected by the overcurrent detection means, the gate voltage is decreased by the first gate voltage decrease means and then, while the switching element keeps an on-state, the gate voltage is decreased by the second gate voltage decrease means, and wherein if it is determined by the gate voltage monitoring means that the gate voltage is less than or equal to the predetermined value when the overcurrent is detected by the overcurrent detection means, the gate voltage is decreased by only the second gate voltage decrease means.

A switching element driving method in accordance with another aspect of the invention is characterized in that if gate voltage of a switching element is greater than a predetermined value when overcurrent that flows through the switching element is detected, a rapid-off operation of decreasing the gate voltage of the switching element at a rate of decrease that is faster than the rate of decrease of the gate voltage at a time of a normal turn-off is caused, and then a slow-off operation of, while the switching element keeps an on-state, decreasing the gate voltage of the switching element at the rate of decrease that is slower than the rate of decrease of the gate voltage at the time of the normal turn-off is caused, and in that if the gate voltage of the switching element is less than or equal to the predetermined value when overcurrent that flows through the switching element is detected, the gate voltage is decreased by only the slow-off operation.

According to these aspects of the invention, an appropriate protection operation can be executed against not only the overcurrent occurring during the completely on-state of a switching element, but also the overcurrent occurring during an early period in a turn-on.

BRIEF DESCRIPTION OF THE DRAWINGS

The foregoing and further objects, features and advantages of the invention will become apparent from the following description of example embodiments with reference to the accompanying drawings, wherein like numerals are used to represent like elements and wherein:

FIG. 3 is a diagram showing a protection operation in the case where overcurrent flows while the power element 10 is completely on;

FIG. 4 is a diagram showing a protection operation of a related-art technology in the case where overcurrent flows while the power element 10 is being turned on;

FIG. 5 is a diagram showing a protection operation in accordance with an embodiment of the invention when overcurrent flows while the power element 10 is being turned on;

DETAILED DESCRIPTION OF THE INVENTION

Figure 1:
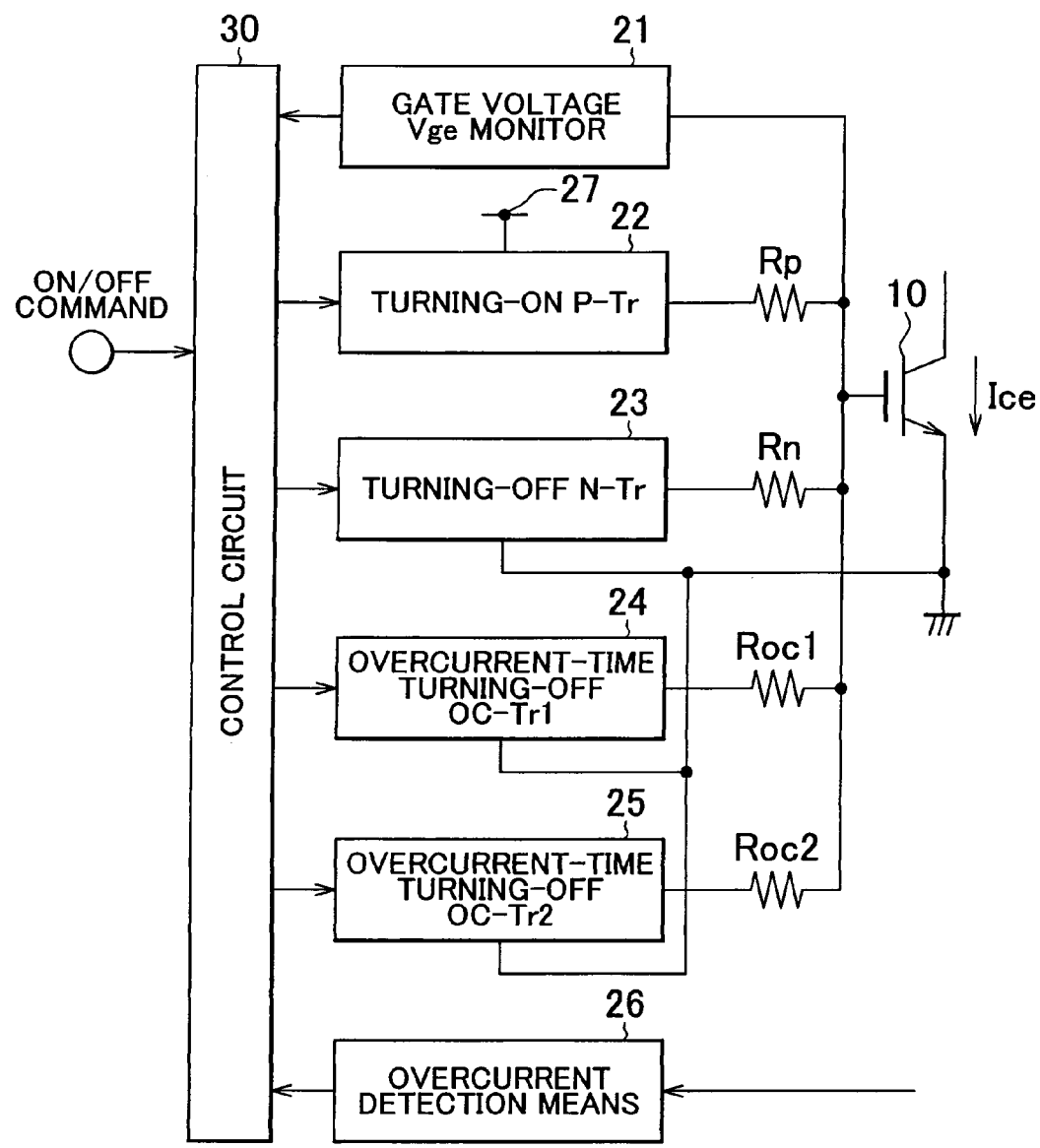
FIG. 1 is a diagram showing an embodiment of a switching element driving device in accordance with the invention.

Hereinafter, example embodiments of the invention will be described with reference to the drawings. FIG. 1 is a diagram showing an embodiment of a switching element driving device in accordance with the invention. The switching element driving device of this embodiment drives a voltage-driven semiconductor switching element, such as an insulated gate bipolar transistor (IGBT), a power MOSFET, etc. (hereinafter, referred to as "power element 10"). The switching element driving circuit of this embodiment includes a turning-on transistor P-Tr, for example, a p-channel FET or the like, as means for turning on a power element 10, and also includes a turning-off transistor N-Tr, for example, an n-channel FET or the like, as means for turning off the power element 10. Hereinafter, the turning-on transistor P-Tr will be referred to as the "transistor PTr", and the turning-off transistor N-Tr will be referred to as the "transistor NTr".

A control circuit 30 of the switching element driving circuit of the embodiment turns on the transistor PTr and turns off the transistor NTr when it receives a command to turn on the power element 10 from an external device, such as a microcomputer or the like. When the transistor PTr is turned on and the transistor NTr is the turned off, the gate of the power element 10 is charged by a power supply 27 via the transistor PTr and a gate resistance Rp. If the amount of charge of the gate of the power element 10 is greater than a predetermined value, the power element 10 is turned on.

On the other hand, if the control circuit 30 receives a command to turn off the power element 10 from an external device, such as a microcomputer or the like, the control circuit 30 turns off the transistor PTr and turns on the transistor NTr. When the transistor PTr is turned off and the transistor NTr is turned on, the charge of the gate of the power element 10 is released via the transistor NTr and the gate resistance Rn. When the amount of charge of the gate of the power element 10 is less than or equal to a predetermined value, the power element 10 turns off.

Furthermore, the switching element driving circuit of the embodiment includes overcurrent detection means 26 for detecting overcurrent through the power element 10 in order to prevent the destruction of the power element 10 or its peripheral circuit, which may occur when overcurrent passes through the power element 10 due to a malfunction such as a load shortcircuit or the like. The overcurrent detection means 26 detects overcurrent by a sense insulated gate bipolar transistor (IGBT) system, a shunt resistance system, etc. In the sense IGBT system, a principle current flowing through the power element 10 is detected based on the voltage across a sense resistance that is connected to the emitter (or to the source) of the sense IGBT. In the shunt resistance system, a principle current flowing through the power element 10 is detected based on the voltage occurring across a shunt resistance that is inserted in series in a path through which the principle current flows. The voltage across the sense resistance or the shunt resistance is compared with a reference voltage by a comparator. If the voltage across the sense resistance or the shunt resistance is higher than the reference voltage, the detected principle current may be considered excessively high, that is, overcurrent is flowing through the power element 10.

When the overcurrent detection means 26 detects overcurrent, greater current Ice is flowing through the power element 10 than in a normal condition, where overcurrent is not detected. In such a case, if the power element 10 is turned off in the same manner as in the normal condition, that is, by turning on the transistor NTr as described above, the greater-than-normal current Ice through the power element 10 brings about a greater rate of change of current "dIce/dt", which causes a greater surge voltage of "L*dIce/dt" as a multiplication product with the inductance L of the wiring, the drive-object load, etc., than at the time of a normal turn-off. Such an off-surge voltage may destroy the power element 10 or its peripheral circuit due to excess over the withstanding voltage thereof.

Figure 2:
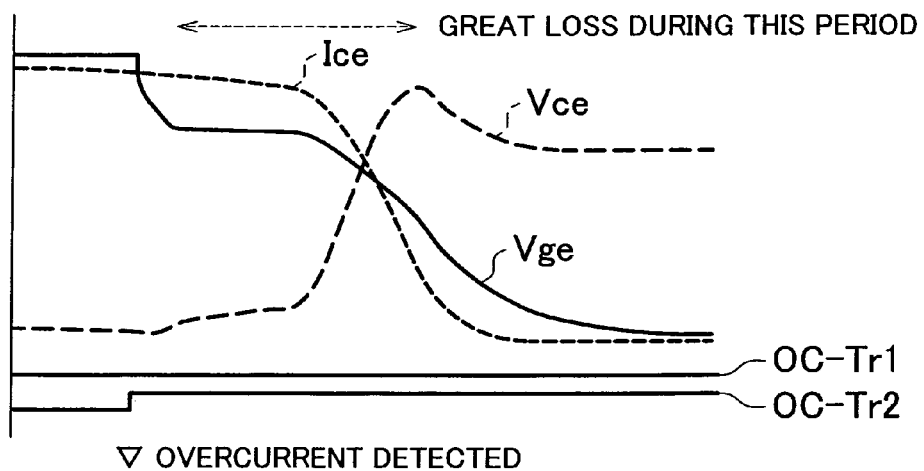
FIG. 2 is a diagram showing behaviors when a power element 10 is turned off via a gate resistance that exceeds gate resistance Rn.

To reduce such off-surge that may destroy the power element 10 or its peripheral circuit, when overcurrent is detected by the overcurrent detection means 26, the power element 10 may be turned off by discharging the gate of the power element 10 via a gate resistance that is greater than the gate resistance Rn connected between the gate of the power element 10 and the transistor NTr. Thus, with the greater the gate resistance, the discharge duration is increased, which reduces the rate of change of current "dIce/dt". FIG. 2 is a diagram showing behaviors when the power element 10 is turned off via a gate resistance that is greater than the gate resistance Rn. However, because the greater gate resistance increases the turn-off duration as indicated in FIG. 2, the turn-off of the power element 10 via the gate resistance greater than the gate resistance Rn results in increased turn-off loss, and may damage the power element 10 by heat.

Therefore, restrain the increase of off-surge and of turn-off loss, the control of the turn-off of the power element 10 is divided into multiple stages. In the switching element driving device of this embodiment, the turn-off of the power element 10 is divided into two stages: a first step and a second step. The switching element driving device of the embodiment includes an overcurrent-time turning-off OC-Tr1 (overcurrent transistor), such as an n-channel FET or the like, that works in the first step, and an overcurrent transistor OC-Tr2, such as an n-channel FET or the like, that works in the second step. The overcurrent transistor OC-Tr1 and the overcurrent transistor OC-Tr2 release the charge of the gate of the power element 10 if overcurrent is detected by the overcurrent detection means 26. Hereinafter, the overcurrent transistor OC-Tr1 will be referred to as the "transistor OCTr1", and the overcurrent transistor OC-Tr2 will be referred to as the "transistor OCTr2".

Figure 6:
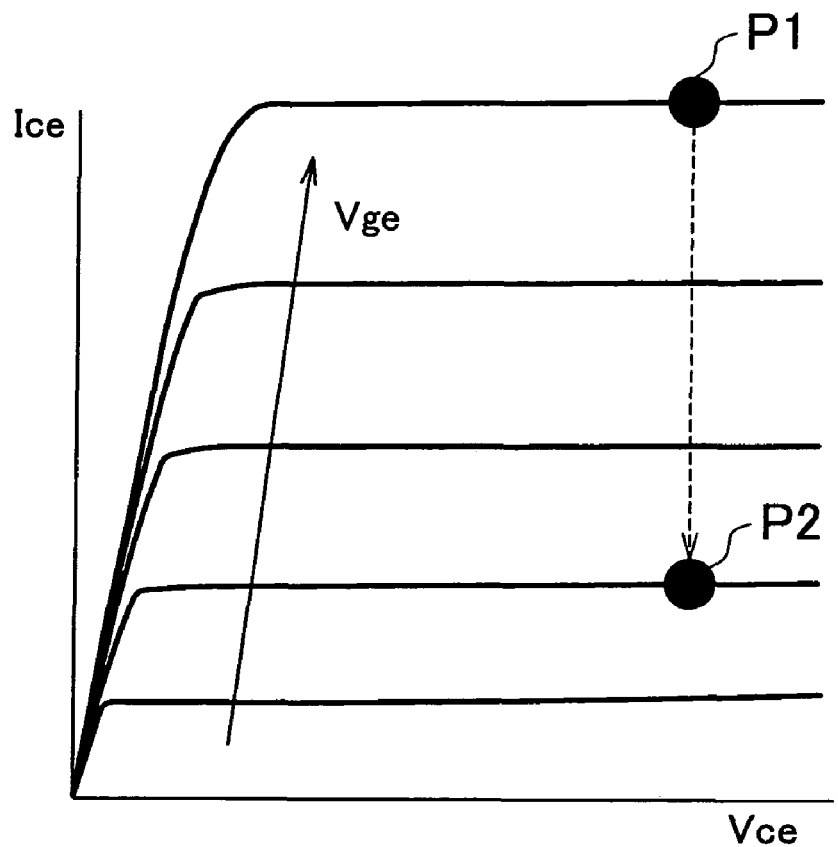
FIG. 6 shows the Ice-Vce static characteristic of the power element 10.

If the overcurrent detection means 26 detects overcurrent, the control circuit 30 of the switching element driving circuit of this embodiment operates the transistor OCTr1 as the first step so that the charge of the gate of the power element 10 is released via the gate resistance Roc1 and thus the gate voltage Vge is quickly lowered to a voltage that is not below a threshold voltage at which the power element 10 becomes completely off. In order to lower the gate voltage Vge more quickly than in the case of a normal turn-off, the resistance value of the gate resistance Roc1 is made smaller than the resistance value of the gate resistance Rn. Due to this, the operating point on the Ice-Vce static characteristic of the power element 10 shown in FIG. 6 shifts from a point P1 to a point P2, so that the peak current value of the current Ice flowing through the power element 10 is restrained and the turn-off loss is reduced. In order to stop the decrease of the gate voltage Vge of the power element 10 at a voltage that is not below the threshold voltage at which the power element 10 becomes completely off, various measures may be taken. For example, a timer or the like may be used so that the voltage decrease stops at the elapse of a fixed time, or the transistor PTr and the transistor OCTr1 may be turned on simultaneously, so that the gate voltage Vge becomes a divided voltage value of the supply voltage 27 determined by the resistance Rp and the resistance Roc1.

Figure 3:
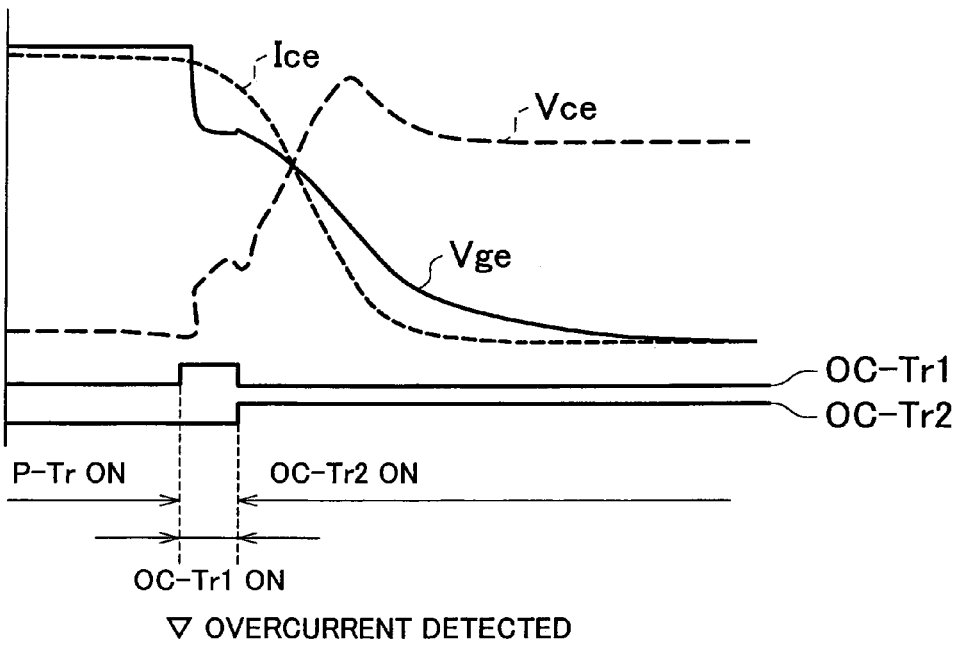

After a fixed time of restraining the peak current value of the current Ice in the first step, the control circuit 30 of the switching element driving circuit of this embodiment turns off the transistor OCTr1 operated in the first step, and then turns on the transistor OCTr2 in the second step. By turning on the transistor OCTr2, the charge of the gate of the power element 10 is released via the transistor OCTr2 and the gate resistance Roc2 to slowly reduce the gate voltage Vge of the power element 10. In order to reduce the gate voltage Vge more slowly than in the case of a normal turn-off, the resistance value of the gate resistance Roc2 is made greater than the resistance value of the gate resistance Rn. Due to this, the power element 10 undergoes a slow-off operation as shown in FIG. 3, so that the increase in the off-surge voltage is restrained without causing a great rate of change of current "dIce/dt".

Figure 4:
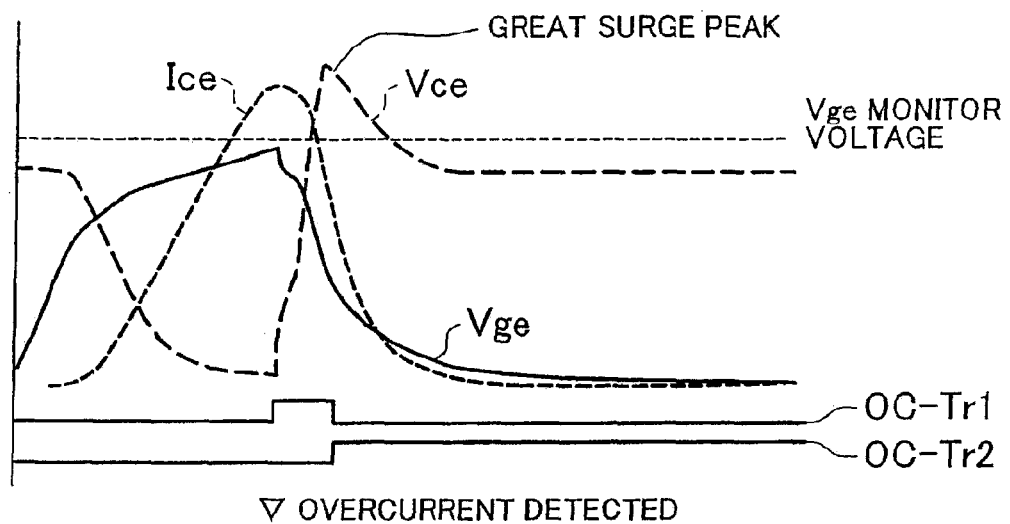

However, when overcurrent is detected by the overcurrent detection means 26 before the gate voltage Vge of the power element 10 sufficiently rises in a turning-on process, the first step of operating the transistor OCTr1, which releases the charge of the gate of the power element 10 via the gate resistance Roc1 more rapidly than normal, will result in a situation where the gate voltage Vge that has not sufficiently risen is reduced to a voltage below the threshold voltage for the complete turn-off of the power element 10, that is, the operation of the transistor OCTr1 will turn off the power element 10 instead of the restraining of the peak current value. Hence, the off-surge voltage will be increased as shown in FIG. 4, so that the intended protection of the power element 10 is not possible.

Figure 5:
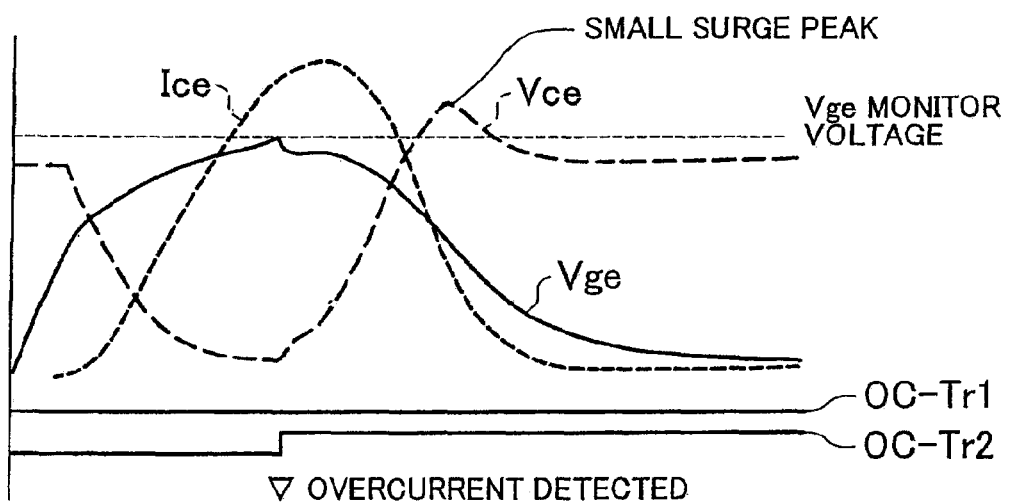

To avoid this, the switching element driving circuit of this embodiment monitors the gate voltage Vge, and performs only the second step operation without performing the first step operation if the gate voltage Vge is less than or equal to a predetermined monitor voltage. Therefore, when overcurrent is detected by the overcurrent detection means 26 before the gate voltage Vge of the power element 10 sufficiently rises in a turning-on process as shown in FIG. 5, the power element 10 is not caused to undergo a rapid-off operation but is caused to undergo a slow-off operation, so that the increase of the off-surge voltage can be restrained. At this time, because the current Ice through the power element 10 is still small, the turn-off loss is sufficiently smaller than in the case where overcurrent is detected during the completely on-state. Thus, the intended protection of the power element 10 is reliably achieved.

Incidentally, the magnitude of the off-surge voltage and of the turn-off loss change in accordance with the inductance of the load or the like driven by the power element 10 and the resistance constants and parasitic capacitances of various circuit elements. Therefore, the predetermined monitor voltage for determining whether to carry out the first step operation and the second step operation should be determined by simulation in accordance with a switching drive circuit that is a protection object. The monitor voltage is, as a minimum requirement thereof, a value that is greater than the gate voltage at which the power element 10 begins to turn on, and that is smaller than the gate voltage at which the power element 10 begins to be completely on. For example, where the gate voltage at which the power element 10 begins to turn on is 5 V and the gate voltage at which the power element 10 begins to be completely on is 15 V, the monitor voltage may be appropriately set at 8 to 12 V.

Figure 7:
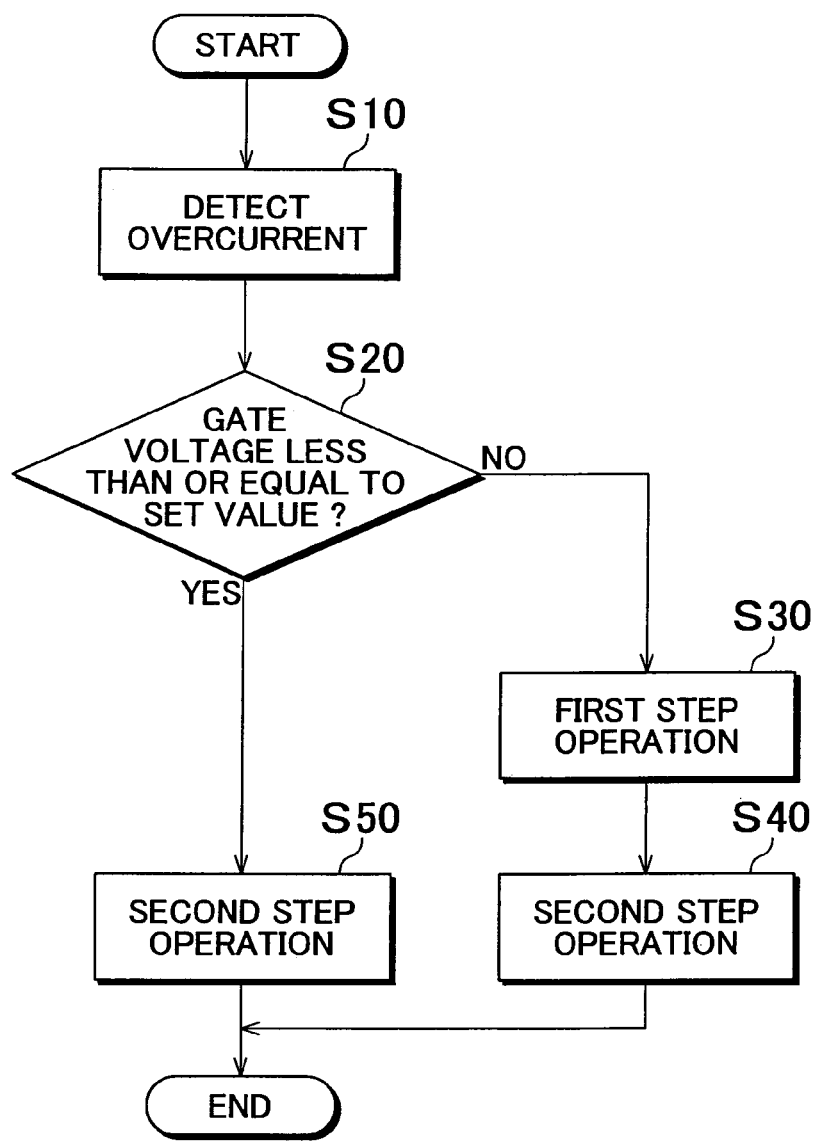
FIG. 7 shows an embodiment of a switching element driving method in accordance with the invention.

FIG. 7 shows an embodiment of a switching element driving method in accordance with the invention. If overcurrent is detected by the overcurrent detection means 26 (step 10), the control circuit 30 changes the method of decreasing the gate voltage depending on whether or not the gate voltage is less than or equal to a predetermined value (step 20). If the gate voltage is not less than or equal to the predetermined value, it is assumed that the power element 10 is completely on, and the control circuit 30 carries out the first step operation followed by the second step operation (steps 30 and 40). On the other hand, if the gate voltage is less than or equal to the predetermined value, it is assumed that the power element 10 is not completely on, and the control circuit 30 carries out only the second step operation (step 50).

Thus, according to the foregoing embodiments, in order to turn off the power element when an overcurrent malfunction of the power element has occurred without damaging the power element or the like due to increased off-surge voltage or increased turn-off loss, the first step operation and the second step operation are carried out. However, when overcurrent is detected during a turning-on process of the power element, the operation of the first step is not carried out, instead only the operation of the second step is carried out. Thus, both the increase of the off-surge voltage and increase of the turn-off loss are restrained, and the protecting operation against overcurrent is stably executed regardless of whether it is during an early period in a turning-on process, or the completely on-state of the power element, or the like.

While the invention has been described with reference to example embodiments thereof, it is to be understood that the invention is not limited to the described embodiments or constructions. To the contrary, the invention is intended to cover various modifications and equivalent arrangements. In addition, while the various elements of the example embodiments are shown in various combinations and configurations, other combinations and configurations, including more, less or only a single element, are also within the spirit and scope of the invention.

The invention claimed is:

1. A switching element driving method comprising:
   detecting an overcurrent that flows through a switching element;
   detecting a gate voltage of the switching element if the overcurrent that flows through the switching element is detected;
   causing a rapid-off operation of decreasing the gate voltage of the switching element at a faster rate than the rate of decrease of the gate voltage at a time of a normal turn-off, where an overcurrent is not detected, and, while the switching element keeps an on-state, then causing a slow-off operation of decreasing the gate voltage of the switching element at a slower rate of decrease than the rate of decrease of the gate voltage at the time of the normal turn-off, if the detected gate voltage of the switching element is greater than a predetermined value; and
   decreasing the gate voltage by only the slow-off operation if the detected gate voltage of the switching element is less than or equal to the predetermined value.

2. A switching element driving device comprising:
   an overcurrent detection device that detects an overcurrent that flows through a switching element;
   a gate voltage monitoring device that monitors a gate voltage of the switching element;
   a first gate voltage decrease device that decreases the gate voltage of the switching element at a faster rate than the rate of decrease of the gate voltage at a time of a normal turn-off; where an overcurrent is not detected by the overcurrent detection device;
   a second gate voltage decrease device that decreases the gate voltage of the switching element at a slower rate than the rate of decrease of the gate voltage at the time of the normal turn-off; and
   a control device that decreases the gate voltage by the first gate voltage decrease device and then, while the switching element remains on, decreases the gate voltage by the second gate voltage decrease device if it is determined by the gate voltage monitoring device that the gate voltage is greater than a predetermined voltage when the overcurrent detection device detects the overcurrent, and decreases the gate voltage by only the second gate voltage decrease device if it is determined by the gate voltage monitoring device that the gate voltage is less than or equal to the predetermined value when the overcurrent detection device detects the overcurrent.

* * * * *